US010564201B1

(12) United States Patent
Shaffer (10) Patent No.: US 10,564,201 B1
(45) Date of Patent: Feb. 18, 2020

(54) TESTING ANTENNA SYSTEMS (71) Applicant: Quantum Valley Ideas Laboratories, Waterloo (CA)

(72) Inventor: James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 16/410,428

(22) Filed: May 13, 2019

Related U.S. Application Data

(63) Continuation of application No. PCT/CA2019/050277, filed on Mar. 7, 2019.

(60) Provisional application No. 62/786,675, filed on Dec. 31, 2018.

(51) Int. Cl.
*G01R 29/08* (2006.01)
*G01R 29/10* (2006.01)
*G01R 33/26* (2006.01)
*H04B 17/10* (2015.01)

(52) U.S. Cl.
CPC ......... *G01R 29/0885* (2013.01); *G01R 29/10* (2013.01); *G01R 33/26* (2013.01); *H04B 17/102* (2015.01)

(58) Field of Classification Search
CPC .... G01R 29/0885; G01R 29/10; G01R 33/26; H04B 17/102
See application file for complete search history.

(56) References Cited

U.S. PATENT DOCUMENTS

| 4,752,557 | A | * | 6/1988 | Tsuchino | ............... | G01T 1/1644 250/483.1 |
| 4,899,345 | A | * | 2/1990 | Cyr | .......................... | G01J 3/12 372/11 |
| 4,995,101 | A | * | 2/1991 | Titterton | ................ | H04B 10/11 342/45 |
| 5,038,406 | A | * | 8/1991 | Titterton | ................ | H04B 10/11 342/45 |
| 7,656,154 | B2 | | 2/2010 | Kawabata et al. | | |
| 8,054,073 | B2 | * | 11/2011 | Tuchman | ............. | G01R 33/032 324/301 |

(Continued)

OTHER PUBLICATIONS

CIPO,International Search Report and Written Opinion dated Aug. 22, 2019, in PCT/CA2019/050277, 10 pgs.

(Continued)

*Primary Examiner* — Dixomara Vargas
(74) *Attorney, Agent, or Firm* — Henry Patent Law Firm PLLC (57) ABSTRACT

In a general aspect, electromagnetic emissions from a cell tower are measured. In some aspects, a method includes receiving, at a vapor-cell sensor system associated with the cell tower, electromagnetic radiation from an antenna system disposed on the cell tower. The method includes receiving, at the vapor-cell sensor system, input optical signals communicated from a laser system through respective input optical channels. Output optical signals are generated in the vapor-cell sensor system based on the input optical signals and the electromagnetic radiation. The method additionally includes sending, from the vapor-cell sensor system, the output optical signals through one or more respective output optical channels to a detection system. Systems for measuring electromagnetic emissions from a cell tower are also presented.

35 Claims, 6 Drawing Sheets

(56) References Cited

U.S. PATENT DOCUMENTS

| | | | | |
|---|---|---|---|---|
| 8,299,858 | B2* | 10/2012 | Gan | G04F 5/145 |
| | | | | 331/3 |
| 8,334,690 | B2 | 12/2012 | Kitching et al. | |
| 8,760,159 | B2* | 6/2014 | Tuchman | G01R 33/032 |
| | | | | 324/304 |
| 10,088,535 | B1* | 10/2018 | Shah | G01R 33/26 |
| 2009/0139781 | A1* | 6/2009 | Straubel | B60L 50/64 |
| | | | | 180/65.1 |
| 2009/0289629 | A1* | 11/2009 | Tuchman | G01R 33/032 |
| | | | | 324/304 |
| 2011/0279115 | A1* | 11/2011 | Tuchman | G01R 33/032 |
| | | | | 324/301 |
| 2016/0363617 | A1 | 12/2016 | Anderson et al. | |
| 2017/0000375 | A1* | 1/2017 | Demas | A61B 5/05 |
| 2017/0067969 | A1* | 3/2017 | Butters | G01R 33/26 |
| 2017/0074652 | A1* | 3/2017 | Send | G01J 3/513 |
| 2017/0315054 | A1* | 11/2017 | Lukens | G01J 3/26 |
| 2018/0145382 | A1* | 5/2018 | Harris | H01M 10/6567 |
| 2019/0187198 | A1 | 6/2019 | Anderson et al. | |

OTHER PUBLICATIONS

Simons, et al., "Fiber-coupled vapor cell for a portable Rydberg atom-based radio frequency electric field sensor", Applied Optics, vol. 57, No. 22, Aug. 1, 2018, 5 pgs.

https://cdn.rohde-schwarz.com/dk/seminars_workshops/BaseStationInstallationandAntennaTesting_2017_V1_Shared_DK_pdf retrieved Nov. 7, 2018, 40 pgs.

"Analyzing RFoCPRI(TM) at Fiber-Based Cell Sites", https://www.viavisolutions.com/en-us/literature/analyzing-rfocpri-fiber-based-cell-sites-application-notes-en.pdf retrieved Nov. 7, 2018, 2 pgs.

"Drone Cell Tower Inspection, Survey, Thermal Imaging and LIDAR", https://abjdrones.com/drone-cell-tower-inspection-services retrieved Nov. 7, 2018, 6 pgs.

"inUAVI: Developing advanced electronic sensors and payloads for UAVs and Aerospace", http://inuavi.io retrieved Nov. 7, 2018, 5 pgs.

Fan, et al., "Atom based RF electric field sensing", Journal of Physics B: Atomic, Molecular and Optical Physics, Sep. 9, 2015, 17 pgs.

Fan, et al., "Dispersive radio frequency electrometry using Rydberg atoms in a prism-shaped atomic vapor cell", J. Phys. B: At. Mol. Opt. Phys. 49, 2016, 8 pgs.

Fan, et al. "Effect of Vapor-Cell Geometry on Rydberg-Atom-Based Measurements of Radio-Frequency Electric Fields", Physical Review Applied 4, 044015, 2015, 7 pgs.

Fan, et al., "Subwavelength microwave electric-field imaging using Rydberg atoms inside atomic vapor cells", Optics Letters, vol. 39, No. 10, May 15, 2014, 4 pgs.

Holloway, et al., "Atom-Based RF Electric Field Measurements: An Initial Investigation of the Measurement Uncertainties", IEEE International Symposium on Electromagnetic Compatibility, 2015, 6 pgs.

Kumar, et al., "Atom-Based Sensing of Weak Radio Frequency Electric Fields Using Homodyne Readout", Scientific Reports 7:42981, Feb. 20, 2017, 10 pgs.

Kumar, et al., "Rydberg-atom based radio-frequency electrometry using frequency modulation spectroscopy in room temperature vapor cells", Optics Express, vol. 25, No. 8, Apr. 17, 2017, 13 pgs.

Sedlacek, et al., "Atom-Based Vector Microwave Electrometry Using Ribidium Rydberg Atoms in a Vapor Cell", Physical Review Letters, Aug. 6, 2013, 5 pgs.

Sedlacek, et al., "Microwave electrometry with Rydberg atoms in a vapour cell using bright atomic resonances", Nature Physics, Sep. 16, 2012, 6 pgs.

Sedlacek, et al., "Quantum Assisted Electrometry using Bright Atomic Resonances", arXiv:1205.4461v1 [physics.atom-ph], May 20, 2012, 15 pgs.

Shaffer, et al., "A read-out enhancement for microwave electric field sensing with Rydberg atoms", SPIE Photonics Europe, 2018, Strasbourg, France, 2018, 11 pgs.

Anderson, et al., "A self-calibrating SI-traceable broadband Rydberg atom-based radio-frequency electric field probe and measurement instrument", arXiv:1910.07107v2 [physics.atom-ph], Oct. 18, 2019, 12 pgs.

* cited by examiner

TESTING ANTENNA SYSTEMS

CROSS-REFERENCE TO RELATED APPLICATIONS

This application is a continuation of International App. No. PCT/CA2019/050277, filed Mar. 7, 2019, which claims priority to U.S. Provisional Application Ser. No. 62/786,675 filed Dec. 31, 2018, the disclosures of which, are hereby incorporated herein by reference.

BACKGROUND

The following description relates to testing antenna systems.

Cellular communication systems use antenna systems installed at base stations to communicate wirelessly with cellular-enabled devices ("user equipment"). So-called 5G cellular communication systems, which use the millimeter wave spectrum, have been developed to generally increase the data rate and enhance the quality of the signal. The millimeter wave spectrum is a band of the radio frequency spectrum that covers extremely high-frequency and very high-frequency bands. Millimeter waves have wavelengths ranging from 10 mm to 1 mm. For many applications, millimeter waves are superior to infrared and microwaves, and for these reasons millimeter wave antennas may also be used in many other contexts (e.g., military and aerospace environments) for wireless communications and other applications.

DETAILED DESCRIPTION

In some aspects of what is described here, systems and methods are provided for measuring electromagnetic emissions from a cell tower. The cell tower may include a cellular antenna system that can be, for example, a 5G antenna system. In some implementations, a system for measuring electromagnetic emissions from a cell tower includes a vapor-cell sensor system positioned to receive electromagnetic radiation from an antenna system disposed on the cell tower. The vapor-cell sensor system may be configured to generate one or more output optical signals based on the electromagnetic radiation and input optical signals. The system may also include input optical channels configured to communicate the input optical signals from a laser system to the vapor-cell sensor system. The system may additionally include one or more output optical channels configured to communicate the one or more output optical signals, respectively, from the vapor-cell sensor system to a detection system. In some instances, the system includes the laser system and a detection system. The laser system may be configured to generate the input optical signals and couple to input optical ports associated with, respectively, the input optical channels. The detection system may be configured to receive the one or more output optical signals and couple to output optical ports associated with, respectively, the one or more output optical channels.

In some implementations, a method for measuring electromagnetic emissions from a cell tower includes receiving, at a vapor-cell sensor system associated with the cell tower, electromagnetic radiation from an antenna system disposed on the cell tower. The method may also include receiving, at the vapor-cell sensor system, input optical signals communicated from a laser system through respective input optical channels. The method may additionally include generating, in the vapor-cell sensor system, output optical signals based on the input optical signals and the electromagnetic radiation. The method may further include sending, from the vapor-cell sensor system, the output optical signals through one or more respective output optical channels to a detection system. In some instances, the laser system is coupled to the input optical channels by respective input optical ports external to the cell tower. The detection system may be coupled to the one or more output optical channels by respective output optical ports external to the cell tower.

In some implementations, the system and method may be used for wavelengths in the GHz to THz regime and can be used to test cell towers to ensure they are operating within specified guidelines (e.g., regulation and failure testing). For example, a vapor-cell sensor system may be placed on each cell tower so that the operation of the antenna system can be calibrated as well as tested. The vapor-cell sensor system may include one or more vapor-cell sensors disposed proximate (e.g., mounted to) each antenna of the antenna system. Several vapor-cell sensors and antennas can be used to provide phase information via interference between sources of electromagnetic radiation, such as the antennas. The vapor-cell sensors of the vapor-cell sensor system can, in some cases, be moved from the near to the far field. The vapor-cell sensors can also be fiber-coupled from an elevated position on the tower, for example, to the ground where they can be hooked up to the laser system and the detection system.

The laser system and the detection system may exist at a separate location from some antenna locations. For example, the laser system and the detection system can be located on a truck and transported between cell towers (or antennas) to survey them. In some cases, vapor cell sensors associated with many antennas in a substantial area can be fiber coupled to a service station to enable remote testing. The detector system can be an individual power sensor or an array of power sensors for optical imaging. The detector system may also be configured to probe each antenna element of a multiple-input, multiple-output (MIMO) antenna by building the vapor-cell sensor system into the MIMO antenna.

In some implementations, the systems and methods described herein can be used to perform over-the-air testing (OTA) of millimeter wave beam forming antennas, to validate their functionality and ensure they conform to operating standards. In some cases, the measurements can be self-calibrated and operate in the millimeter wave regime. Such testing and measurement can be useful in a variety of settings, including cellular base station maintenance and testing. For example, network operators can use the systems and methods described herein to control interference and other performance issues in a cost-effective manner. As another example, regulators or other types of entities can use the measurements provided by these systems and methods to verify compliance with operating standards, e.g., to verify fairness of use of the millimeter wave spectrum.

In many environments, millimeter waves can only be propagated relatively small distances, which is a challenge for the design of 5G communication systems and other communication systems that utilize millimeter waves. The short propagation distance of millimeter waves (e.g., on the order of 5-8 km) may dramatically increase the number of cell towers and other equipment for the implementation of such communication systems, thereby escalating the maintenance costs. Taking 5G cellular systems as an example, beam forming antennas are expected to play an important role and require service and testing. For backhaul systems, 5G nodes may need to be densely deployed throughout cities; in such contexts, efficient maintenance (e.g., service, testing, measurement of a dense network in an urban environment) will improve the operation of the network. In addition, improved OTA testing may help harmonize standards across the globe for millimeter wave technology and promote faster adoption of 5G and other technology implementations.

To overcome free space path loss in millimeter wave communications, antenna arrays are commonly used to achieve higher directionality by forming a steerable beam that points to a target or receiving device. Beamforming antennas typically include an array of elements that are used to obtain a directional characteristic, so called MIMO antennas. OTA testing for the performance evaluation of radiation patterns will be useful for communication systems that use MIMO antennas, for instance, in 5G New Radio (NR) technology. For instance, the antenna array calibration may be important for antenna array beam steering and sidelobe suppression. In some examples, precise phase and amplitude differences among antenna elements may need to be calibrated and adjusted to maximize performance. In some systems, calibrations and optimization may be complicated by the fact that other system elements such as amplifiers or transceivers may be integrated into the antenna system. Many of the parameters affecting the calibration of an antenna system may also change over time, for example, as they are affected by factors such as weather and aging. Multiple field point measurements can be made at the antenna system to characterize a millimeter wave beam.

Testing of 5G cellular systems will be different from testing of other technologies such as 4G (LTE). The cellular industry will want to assure reliability of the network and within the user equipment. For instance, in the United States, carriers have to set industry standards regarding device performance. OTA testing will be useful for the evaluation of systems and components in both mobile and fixed location devices. For example, an absolute, self-calibrated sensor and standard may be useful to make direct comparisons between tests in disparate environments (e.g., in the field versus in a research and development environment). As the transmission distances at millimeter wave frequencies decrease, it becomes more important to accurately test under a wide range of conditions, which include effects like free space path loss, atmospheric absorption, scattering due to rain and particulates, and line-of-sight obstructions. Calibration and standards regarding base stations will also improve the operation of technologies that rely on wireless communications (e.g., autonomous vehicles, drones, and industrial equipment that affect public safety). An absolute, self-calibrated sensor system may also be useful for certification of such systems.

For millimeter wave antennas, almost all components near the antenna—including packaging and mounting apparatus—can affect performance. Other technical challenges related to MIMO antennas include mutual coupling among antenna components and different antennas. Irregularity in the antenna arrays may result in each antenna having to be individually calibrated. There are additional technical challenges at the extremes of size (both small and large) and power that can be mitigated by what is fundamentally a more accurate and electromagnetically transparent, conductor-free probe.

Figure 1:
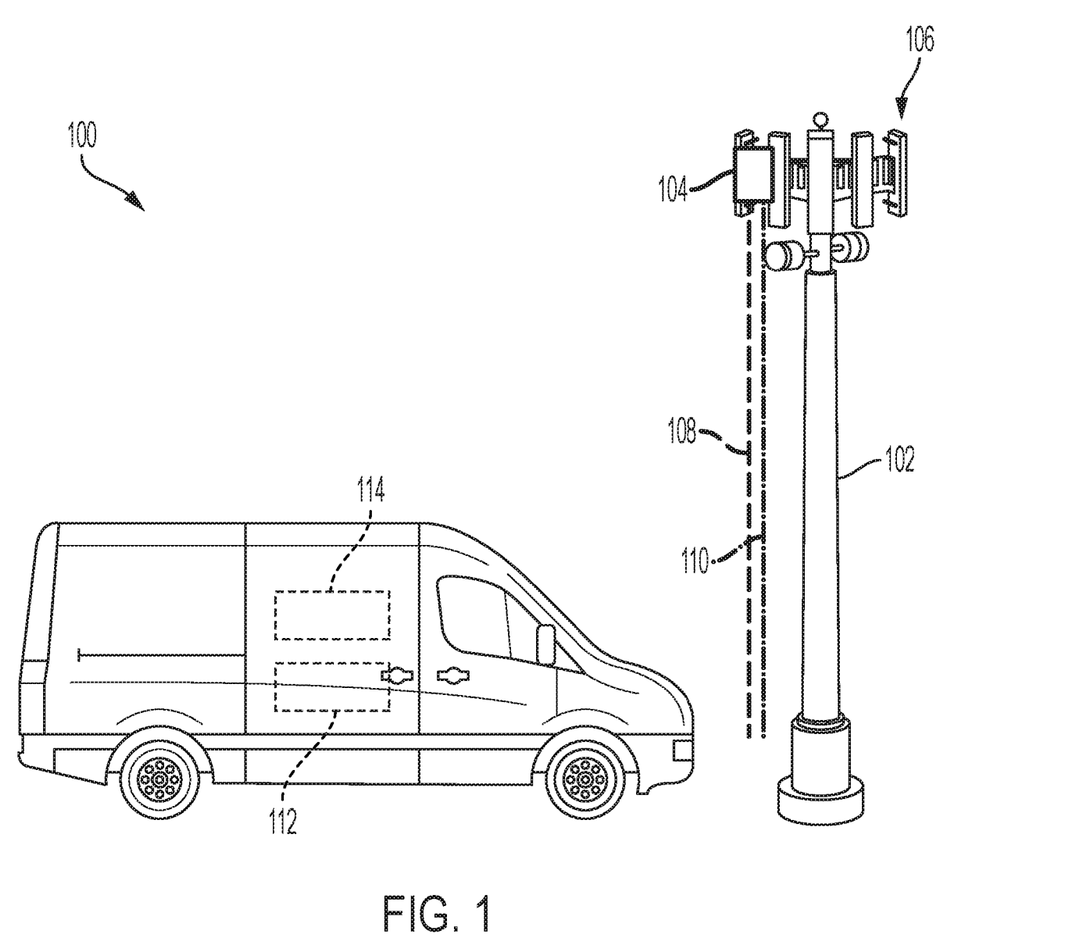
FIG. 1 is a schematic diagram of an example system for measuring electromagnetic emissions from a cell tower.

Now referring to FIG. 1, a schematic diagram is presented of an example system 100 for measuring electromagnetic emissions from a cell tower 102. The example system 100 includes a vapor-cell sensor system 104 positioned to receive electromagnetic radiation from an antenna system 106 disposed on the cell tower 102. The vapor-cell sensor system 104 is configured to generate one or more output optical signals based on the electromagnetic radiation and input optical signals. The example system 100 also includes input optical channels 108 configured to communicate input optical signals from a laser system to the vapor-cell sensor system 104. The example system 100 additionally includes one or more output optical channels 110 configured to communicate the one or more output optical signals from the vapor-cell sensor system 104 to a detection system. In some implementations, such as shown in FIG. 1, at least a portion of the input optical channels 108 and at least a portion of the one or more output optical channels 110 are defined by fiber optic cables.

In some implementations, the vapor-cell sensor system 104 includes a vapor-cell sensor device formed at least in part of a dielectric material that is transparent to the electromagnetic radiation. The vapor-cell sensor device may be of the type described, for example, in the "Microwave electrometry with Rydberg atoms in a vapour cell using bright atomic resonances," by J. A. Sedlacek, et al. (published in *Nature Physics* 8, 819-824, 2012). Other types or configurations of vapor-cell sensor devices may be used in some cases. The dielectric material may define a window for the vapor-cell sensor device, through which, the electromagnetic radiation is received. Examples of the dielectric material include silicon, silicate-based glasses, and quartz. The vapor-cell sensor device may include atoms in a vapor state (e.g., vaporized $^{87}$Rb or $^{133}$Cs) that alter an optical transmission in response to the electromagnetic radiation. The optical transmission may be influenced by a first optical transition and a second optical transition of the atoms in the vapor state. In some instances, additional optical transitions may influence the optical transmission (e.g., a third optical transition).

Figure 2A:
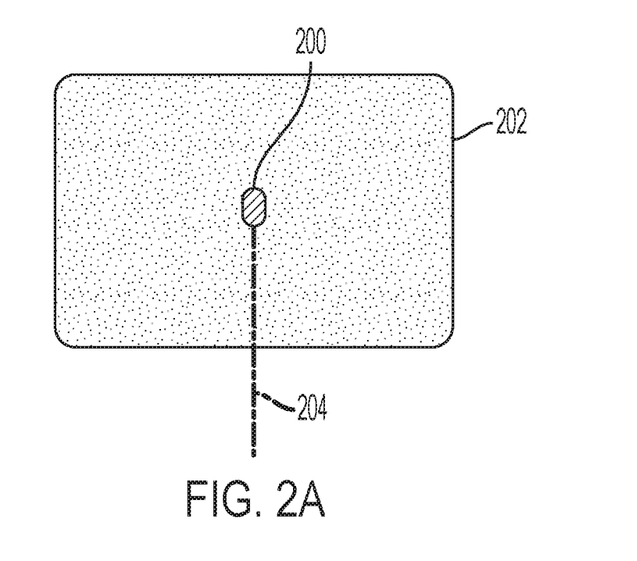
FIG. 2A is a schematic diagram, shown in side view, of an example of a single vapor-cell sensor device coupled to an antenna.

The vapor-cell sensor system 104 may include one or more vapor-cell sensor devices coupled to (e.g., mounted on) individual antennas in the antenna system 160. For example, FIG. 2A presents a schematic diagram, shown in side view, of a single vapor-cell sensor device 200 coupled to an antenna 202. The vapor-cell sensor device 200 may allow an electric field of the antenna 202 to be imaged, thereby allow an emission of electromagnetic radiation from the antenna 202 to be optimized (e.g., a spatial projection or distribution from the antenna 202 to be optimized). The vapor-cell sensor device 200 may be positioned in a central portion of the antenna 202. For example, the vapor-cell sensor device 200 may be a centrally positioned to measure radiated power from the antenna 202. However, other positions are possible. The antenna 202 may be a MIMO antenna defined by a plurality of antennas disposed within an antenna housing. The vapor-cell sensor device 200 may be optically-coupled to one or more fiber optic cables 204 defining an input optical channel and an output optical channel.

Figure 2B:
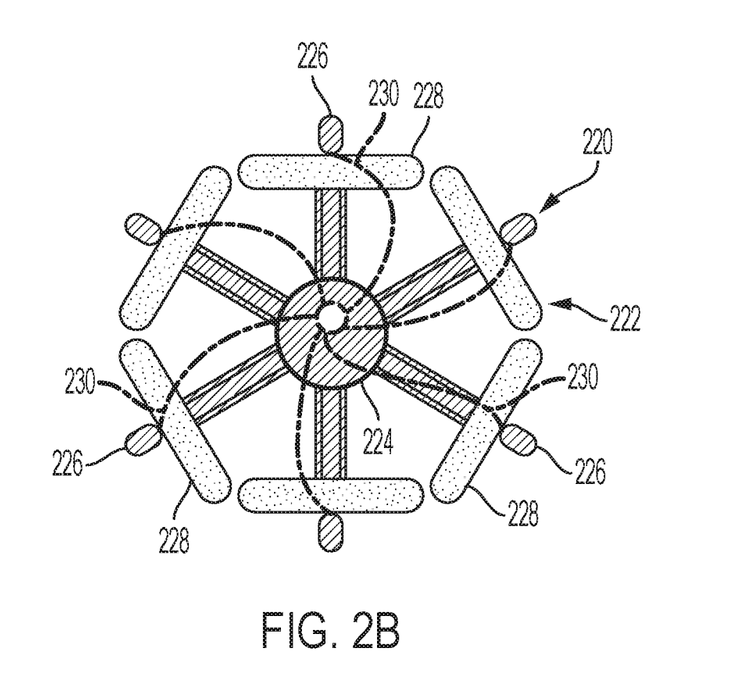
FIG. 2B is a schematic diagram, shown in a top view, of an example a vapor-cell sensor system and an antenna system on a cell tower.

The arrangement depicted in FIG. 2A may serve as a basis for the example system 100 of FIG. 1. For example, FIG. 2B presents a schematic diagram, shown in a top view, of a vapor-cell sensor system 220 and an antenna system 222 on a cell tower 224. The vapor-cell sensor system 220 includes a plurality of vapor-cell sensor devices 226, each coupled to one antenna 228 of a plurality of antennas 228 that define the antenna system 222. The plurality of vapor-cell sensor devices 226 have respective fiber optical cables 230 that serve as corresponding input optical channels and output optical channels. The input and output optical channels may operate collectively as input optical channels and output optical channels for a system that measures electromagnetic emissions from the cell tower 224 (e.g., the example system 100 of FIG. 1). Although FIG. 2A depicts six vapor-cell sensor devices 226 coupled to six corresponding antennas 228 and arranged symmetrically around the cell tower 224, other numbers and arrangements are possible for the vapor-cell sensor devices 226 and antennas 228.

Figure 2C:
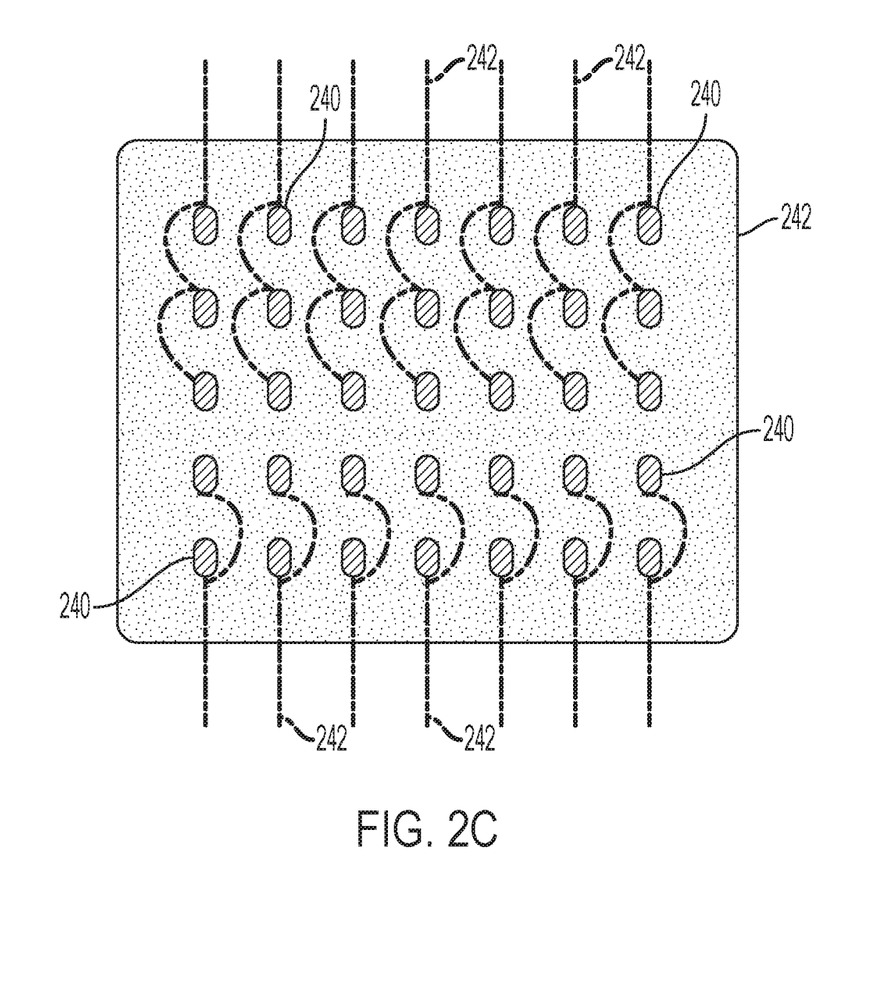
FIG. 2C is a schematic diagram, shown in side view, of an example of an array of vapor-cell sensor devices coupled to an antenna.

In some variations, antennas of the antenna system may have a plurality of vapor-cell sensor devices coupled thereto. FIG. 2C presents a schematic diagram, shown in side view, of an array of vapor-cell sensor devices 240 coupled to an antenna 242. The array of vapor-cell sensor devices 204 may improve an imaging of an electric field of the antenna 242 (e.g., relative to a single vapor-cell sensor device). The antenna 202 may be a MIMO antenna defined by a plurality of antennas disposed within an antenna housing. In the array, subgroups of the vapor-cell sensor devices 240 may be optically-coupled in series using one or more fiber optical cables 244, as shown in FIG. 2C. The fiber optic cables 244 may serve as input optical channels and output optical channels. However, in some variations, one or more fiber optical cables may be uniquely associated with each vapor-cell sensor device 240.

Now referring back to FIG. 1, the antenna system 106 may be configured to produce a spatial distribution of electromagnetic radiation having at least a portion focused along a target direction. For example, the antenna system 106 may include one or more MIMO antennas operable to form beams of electromagnetic radiation. The target direction may terminate at a device configured to receive electromagnetic radiation from the cell tower 102 (e.g., a cellular phone, a notebook computer, a desktop computer, a tablet, a watch, etc.). In some instances, the antenna system 106 is configured to produce electromagnetic radiation having a frequency in a range of 100 MHz to 10 THz. In some instances, the antenna system 106 is configured to produce electromagnetic radiation having a frequency in a range of 2 GHz to 75 GHz. In these instances, the electromagnetic radiation may allow wireless communication using 5G wireless protocols. However, other wireless protocols are possible (e.g., 3G, 4G, etc.).

In some implementations, the example system 100 includes the laser system 112, configured to generate the input optical signals and couple to input optical ports associated with the input optical channels. For example, the laser system 112 may be configured to generate two input optical signals defining the input optical signals. The two input optical signals may be resonant in frequency with respective optical transitions of atoms in the vapor state, such as those contained within vapor-cell sensor devices. A single output optical signal may define the one or more output optical signals generated by the vapor-cell sensor system 104. In another example, the laser system 112 may be configured to generate three input optical signals defining the input optical signals. The three input optical signals may be resonant in frequency with respective optical transitions of atoms in the vapor state, such as those contained within vapor-cell sensor devices. A single output optical signal may define the one or more output optical signals generated by the vapor-cell sensor system 104. In further implementations, the example system 100 includes the detection system 114, configured to receive the one or more output optical signals and couple to output optical ports associated with the one or more output optical channels.

In many implementations, the example system 100 includes input optical ports associated with the input optical channels and output optical ports associated with the one or more output optical channels. The input optical ports and output optical ports may be internal to the cell tower 102. For example, the input optical ports and the output optical ports may be accessible via a service box at a ground-level portion of the cell tower 102. The input optical ports and the output optical ports may also be external to the cell tower 102. For example, the input optical ports and the output optical ports may be located at a remote service station and accessible therein.

In some implementations, such as shown in FIG. 1, the laser system 112 and the detection system 114 are disposed on a mobile platform, such as a service van. The mobile platform may be operable to transport the laser detection system 112 and the detection system 114 to other cell towers having systems analogous to example system 100 of FIG. 1. In other implementations, the laser system 112 and the detection system 114 are disposed on a stationary platform adjacent the cell tower 102. For example, the laser system 112 and the detection system 114 may be disposed adjacent a ground-level portion of the cell tower 102 in a protective enclosure (e.g., a service shed). The laser system 112 and the detection system 114 may be optically-coupled to, respectively, input optical ports associated with the input optical channels and output optical ports associated with the one or more output optical channels.

Figure 3:
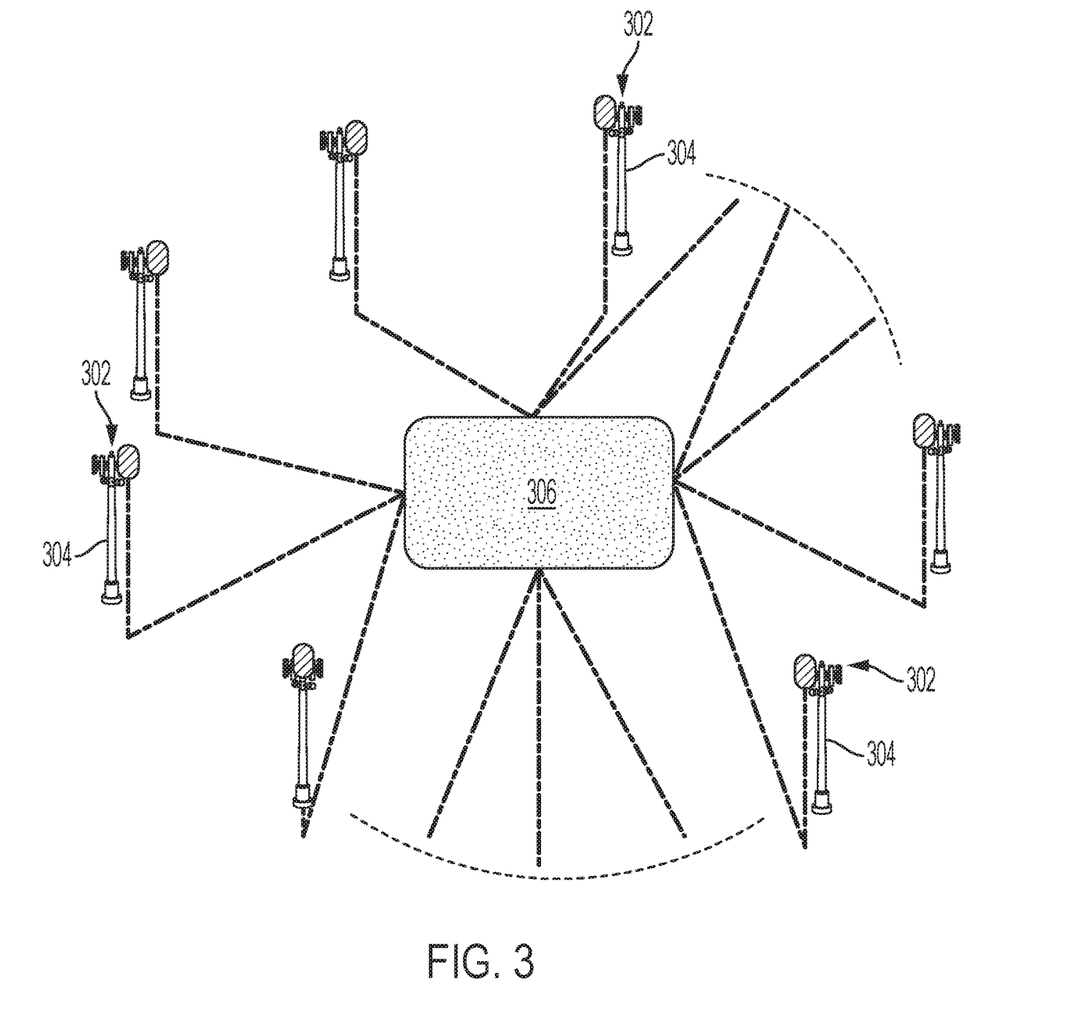
FIG. 3 is a schematic diagram of a wide area deployment in which multiple instances of the example system of FIG. 1 are deployed on respective cell towers.

In some implementations, the input optical ports and the output optical ports are located at a remote service station. In these implementations, the input optical channels extend from the vapor-cell sensor system 104 to input optical ports at the remote service station. Similarly, the one or more output optical channels extend from the vapor-cell sensor system 104 to the output optical ports at the remote service station. FIG. 3 presents a schematic diagram of a wide area deployment 300 in which multiple instances 302 of the example system 100 of FIG. 1 are deployed on respective cell towers 304. Some of the instances 302 and their respective cell towers 304 are omitted from FIG. 3 for clarity. The wide area deployment 300 includes a remote service station 306 optically-coupled to each instance 302 of the example system 100 of FIG. 1. Such optical-coupling occurs through input optical channels and output optical channels optionally defined by fiber optic cables. The remote service station 306 includes at least one input optical port and at least one output optical port for each instance 302. In some variations, the instances 302 share a laser system and a detection system in common. For example, the laser system and the detection system may be disposed on a mobile platform, which in turn, may transport the laser system and the detection system to the remote service station for coupling to, respectively, the input optical ports and output optical ports. In another example, the laser system and the detection system are located at the remote service station 306. The laser system and the detection system may be optically-coupled to, respectively, the input optical ports and the output optical ports.

Now referring back to FIG. 1, during operation the antenna system 106 may generate electromagnetic radiation corresponding to cellular communication, test or reference patterns, or other types of electromagnetic radiation. The electromagnetic radiation is received by the vapor-cell sensor system 104, which may include passing the electromagnetic radiation through a window formed of the dielectric material. In particular, the electromagnetic radiation (or portions thereof) may be received one or more vapor-cell sensor devices of the vapor-cell sensor system 104, each of which, includes a window formed of the dielectric material. The one or more vapor-cell sensor devices contain atoms in the vapor state that interact with the electromagnetic radiation. During such interaction, the input optical channels may communicate input optical signals from the laser system 112 to the vapor-cell sensor system 104. The input optical signals pass through the atoms in the vapor state, which undergo a change in optical transmission due to the presence of the electromagnetic radiation. For example, the laser system 112 may produce a first input optical signal (or probe laser signal) and a second input optical signal (or coupling laser signal) that pass through the atoms in the vapor state. The first input optical signal may experience a frequency-dependent absorption (or transmission) due to the presence of the electromagnetic field. Such a phenomenon may represent an atom-based, electromagnetically-induced transparency (EIT).

Also during interaction of the electromagnetic radiation with the atoms in the vapor state, the vapor-cell sensor system 104 may generate the one or more output optical signals. The one or more output optical signals may be based on the input optical signals after interacting with the atoms in the vapor state. In particular, the one or more output optical signals may be generated when the one or more output optical channels receive at least one input optical signal after interacting with the atoms in the vapor state. For example, the first input optical signal (or probe laser signal) may be received by the one or more output optical channels after interacting with the atoms in the vapor state. The first input optical signal may be communicated by the one or more output optical channels to the detection system 114 and thereby define (or be part of) the one or more output optical signals. The detection system 114 may be coupled to output optical ports associated with the one or more output optical channels. The detection system 114 may also generate data, based on the one or more output optical signals, that represent characteristics of the electromagnetic radiation. Examples of such characteristics include a spatial distribution of the electromagnetic radiation, a total-radiated power (TRP) of the electromagnetic radiation. The data may represent characteristics of the antenna system 106 such as a total isotropic sensitivity (TIS) of the antenna system 106.

In some implementations, the example system 100 is configured for GHz to THz frequencies, and as such, can be used to measure and test millimeter-wave antenna systems (e.g., antenna systems deployed on cell towers) and ensure that they are operating within specified guidelines, including governmental regulations. For example, a vapor-cell sensor system may be placed on each cell tower or antenna system so that the operation of the antenna system (or individual antennas therein) can be calibrated as well as tested. Several vapor-cell sensor devices and corresponding antennas could be used to provide phase information via interference between sources of electromagnetic radiation. The vapor-cell sensor system (or individual vapor-cell sensor devices) can be moved from the near to the far field in some instances. The vapor-cell sensor system may be fiber coupled from the tower to the ground where it can be hooked up to the laser systems and detection systems, which collectively may define a sensor readout apparatus. The sensor readout apparatus does not necessarily have to exist at every location associated with the antenna system. The laser system and the detection system can be located on a truck and transported between antenna systems to survey them, as shown in FIG. 1. The laser system and the detection system can be located elsewhere, for example, in a central data processing and testing station as shown in FIG. 3. The detector system can be optically-coupled to an individual vapor-cell sensor device configure to measure electromagnetic power. The detector system can also be optically-coupled to an array of vapor-cell sensor devices configured to image spatial distributions of electromagnetic radiation or positioned to probe each element of a multiple input-multiple output (MIMO) antenna.

In some implementations, measurements of TRP determine an amount of power that is radiated by the antenna system 106 (or individual antennas thereof) when the antenna system 106 is connected to the transmitter. TRP testing is a type of active measurement in which the transmitter/receiver in a device under test (DUT) is active and powered up. The radiated power of the antenna system 106 (or individual antennas thereof) is measured at different locations around the device. In some cases, a three-dimensional pattern that characterizes the performance of the DUT is put together from the spatially distributed measurements. Such a measurement can be a series of measurements performed at a single point in space as the electromagnetic radiation is formed into a beam and the beam is steered to different positions. In other realizations, an array of vapor-cell sensor devices or an imaging cell can be placed in the field of the antenna system 106 and measurements can be carried out simultaneously at multiple field points. A transparent dielectric vapor-cell sensor device may reduce or eliminate interference between multiple measuring devices in the field of the DUT, thereby enabling the field to be measured in a single shot. Even with a single vapor-cell sensor device, the vapor-cell sensor device may remain fixed in place on the field unit without disturbing the emission, thereby making single point measurements better by allowing changes in emission to be more easily tracked.

In some implementations, measurements of TIS can be used to determine the sensitivity between a receiver and the antenna system 106. TIS testing is another type of active measurement, and it can be used to measure the sensitivity of a device caused by noise impairment by finding the lowest power level where the device can remain connected to a signal. Conventional TIS measurements usually take place with test base station in an anechoic chamber. In some instances, a bit error rate (BER) measurement can be performed to characterize the device. For 5G systems, however, some of these measurements may require field testing. Since TIS measurements are sensitive to small fields, an electrically transparent, absolute, self-calibrated vapor cell sensor device can be used to normalize power levels and assure the performance of a transmitting antenna.

Figure 4:
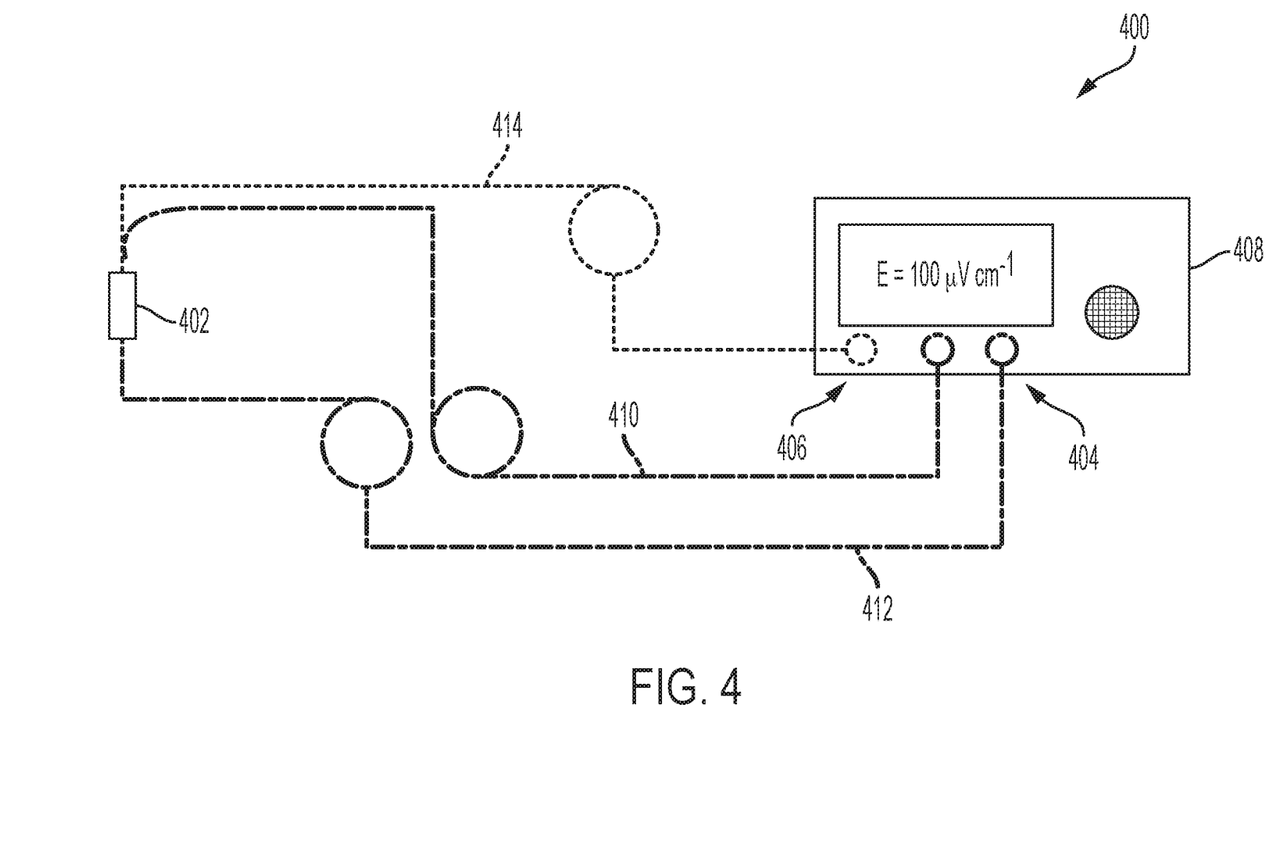
FIG. 4 is a schematic diagram of an example measurement system for determining characteristics of electromagnetic radiation.

Now referring to FIG. 4, a schematic diagram is presented of an example measurement system 400 for determining characteristics of electromagnetic radiation. The example measurement system 400 may include a vapor-cell sensor device 402 (or network of such devices) that is (are) fiber-coupled to a laser system 404 and a detection system 406. The laser system 404 and the detection system 406 may be incorporated into a single enclosure or assembly 408, such as shown in FIG. 4. However, in some variations, the laser system 404 and the detection system 406 may be in separate enclosures. The laser system 404 may be operable to generate probe and coupling light for an EIT-like atom-based electromagnetic field sensing. The probe and coupling light can be used to measure a high-frequency electromagnetic field (MHz-THz) at a position of the vapor cell sensor device 402. The position of the vapor-cell sensor device 402 may be remote to, located at, or located near a position of a cell tower antenna. The probe and coupling light may be communicated to the vapor-cell sensor device 402 by, respectively, a first fiber optic cable 410 and a second fiber optic cable 412. Similarly, an output optical signal from the vapor-cell sensor device 402 may be communicated to the detection system 406 (or single enclosure or assembly 408) by a third fiber optic cable 414. A transmission of the probe light through the vapor-cell sensor device 402 may define the output optical signal. In some instances, the vapor-cell sensor device 402 may serve as part of a plurality of vapor-cell sensor devices (e.g., an array) defining a vapor-cell sensor system.

The laser system 404 may be a tunable laser system used to supply the light and the detection system 406 may be configured to measure the transmission of probe light through the vapor-cell sensor device 402. The laser system 404 and the detection system 406 can be mounted in a truck for transportation between different antenna systems. Alternatively, the laser system 404 and the detection system 406 can be located at a central control center, thereby reducing or eliminating a need to duplicate these systems 404, 406 at every cell tower. In this configuration, the example measurement system 400 allows testing of one or more cell towers at ground level. Multiple vapor-cell sensor devices 402 can be mounted on antenna systems of cell towers, including individual antennas of the antenna systems. In FIG. 4, the vapor-cell sensor device 402 may be formed at least in part by a dielectric material transparent to electromagnetic radiation generated by the antenna systems (or individual antennas thereof). Since the example vapor-cell sensor device 402 is formed of the dielectric material, the vapor-cell sensor device 402 will minimally perturb electromagnetic fields, e.g., the vapor-cell sensor device 402 is more electromagnetically transparent than if formed entirely with non-dielectric materials. Moreover, since the example vapor-cell sensor device 402 measures electromagnetic fields using atoms in a vapor state, the vapor-cell sensor device 402 can serve as an absolute calibration for regulation and testing: Measurements of the example vapor-cell sensor device 402 depend only on physical constants and the properties of the atom.

The example measurement system 400 with vapor-cell sensor devices 402 formed at least in part of the dielectric material can be implemented in several different ways. For example, a single vapor-cell sensor device or array of vapor-cell sensor devices can be used. Schematic diagrams of example configurations are shown in FIGS. 2A-2C. However, other configurations are possible.

In some aspects of operation, the example measurement system 400 may use the phenomena described in relation to FIG. 1 to measure electromagnetic radiation from antennas on cell towers. In some cases, the antennas may operate with 5G cellular communication protocols and may include beam-forming antennas. The example measurement system 400 can perform OTA measurements at a base station, including measurements of TRP and TIS. The example measurement system 400 can include a fiber-coupled atomic vapor cell, and the vapor-cell sensor device 402 can be deployed as a sensor head. The fiber optic cables (e.g. fiber optic cables 410, 412, 414) can be routed to a ground-level of a cell tower for connecting to a laser system and a detection system. The example measurement system 400 may measure a frequency-dependent absorption (or transmission) of a probe light through the vapor-cell sensor device 402 in the presence of a coupling light. Electronics in the example measurement system 400 can process data from the detection system to determine a power incident on the vapor-cell sensor device 402. The laser system generates the probe light and the coupling light, which make a narrow spectral bandwidth measurement of an effect of the electromagnetic radiation on a Rydberg transition or state of vaporized atoms within the vapor-cell sensor device 402. The laser system may also include a frequency-stabilized diode lasers or fiber-amplified diode lasers. Other types of laser systems that can perform sub-Doppler spectroscopy may also be used. The laser system and the detection system may be optically-coupled to the vapor-cell sensor device 402 to perform measurements of the electromagnetic radiation. The laser system and detection system can be used for different vapor-cell sensor devices so that vapor-cell sensor devices at different locations can be fixed in position while the laser system and detection system can be transported to their locations as needed (e.g., in a service van or truck, as shown in FIG. 1). Alternatively, the laser system and detection system can be transported to a central data station that is fiber coupled to a number of base stations and antenna systems (e.g., as shown in FIG. 3). In some implementations, a compact, miniaturized detection and laser system can be located at the base station or near several clustered base stations.

Figure 5A:
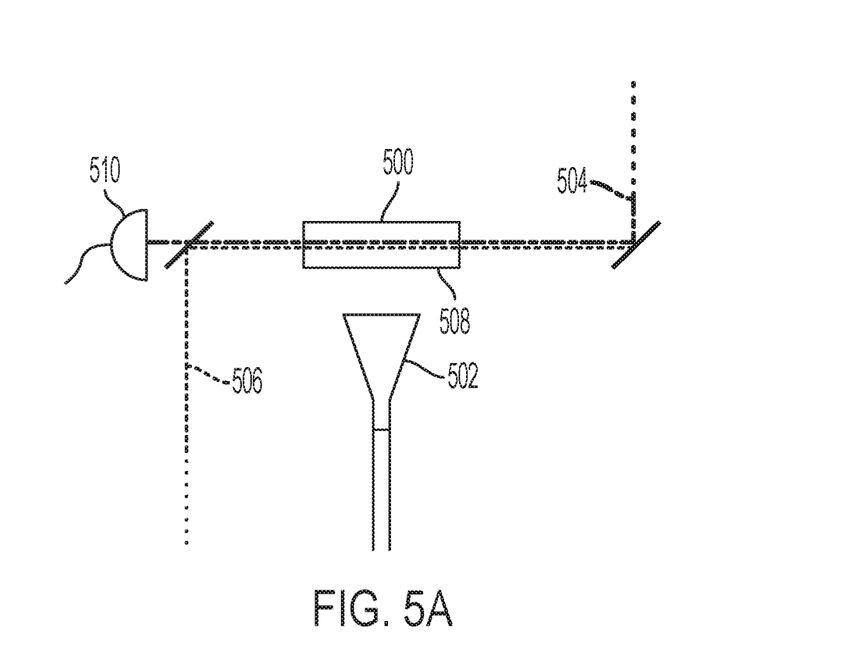
FIG. 5A is a schematic diagram of an example vapor-cell sensor device positioned proximate an antenna configured to generate electromagnetic radiation.

Now referring to FIG. 5A, a schematic diagram is presented of an example vapor-cell sensor device 500 positioned proximate an antenna 502 configured to generate electromagnetic radiation. The antenna 502 may generate electromagnetic radiation that corresponds to cellular communication or generate test patterns of electromagnetic radiation. The example vapor-cell sensor device 500 is configured to receive input optical signals, and in response, generate one or more output optical signals. In FIG. 5A, the vapor-cell sensor device 500 receives a probe beam of light 504 and a coupling beam of light 506. The probe beam of light 504 and the coupling beam of light 506 may be generated by respective lasers, such as a tunable laser or a diode laser. The probe beam of light 504 and the coupling beam of light 506 pass through the vapor-cell sensor device 500 along a common optical pathway, but in opposite directions. While doing so, the probe and coupling beams of light 504, 506 interact with atoms in the vapor state that are contained within an enclosure of the vapor-cell sensor device 500. A side 508 of the enclosure facing the antenna 502 may be formed of a dielectric material transparent to the electromagnetic radiation, thereby serving as a window for the electromagnetic radiation. Other sides of the enclosure may also be formed of the dielectric material. Concomitant with receiving the probe beam of light 504 and the coupling beam of light 506, the vapor-cell sensor device 500 may also receive the electromagnetic radiation (or portion thereof) through the side 508 of the enclosure. The electromagnetic radiation may alter an optical transmission or the probe beam of light 504 through the vapor-cell sensor device 500, which is recorded by a detector 510. Measurements of the optical transmission or the probe beam of light 504 may allow the vapor-cell sensor device 500 to measure characteristics of the electromagnetic radiation.

Figure 5B:
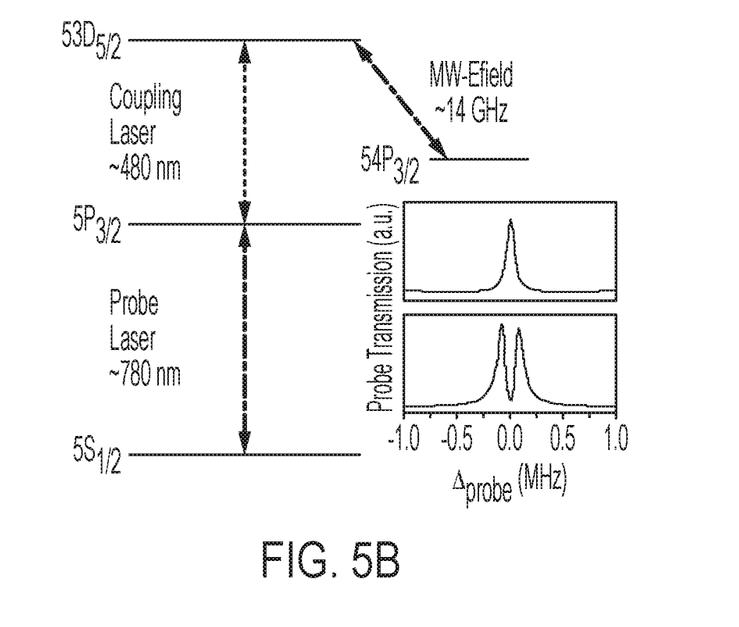
FIG. 5B is a schematic diagram of an example atomic energy level structure for a two-photon measurement based on $^{87}$Rb atoms in a vapor state.

Measurements of characteristics of the electromagnetic radiation may rely on two or more optical transitions associated with the atoms in a vapor state. FIG. 5B presents a schematic diagram of an example atomic energy level structure for a two-photon measurement based on $^{87}$Rb atoms in a vapor state. In FIG. 5B, light used to access the $5S_{1/2}$-to-$5P_{3/2}$ optical transition and the $5P_{3/2}$-to-$53D_{5/2}$ optical transition is generated from diode lasers. However, other types of lasers or laser systems may be used. A transmission of light from a probe laser is recorded in the presence of light from a coupling laser. If the electromagnetic radiation is not interacting with the $^{87}$Rb atoms, a narrow peak in probe light transmission is observed where the probe would normally be absorbed, as shown in the upper graph of the inset. Such a phenomenon may be reference as an electromagnetically-induced transparency (EIT). When electromagnetic radiation interacts with the $^{87}$Rb atoms—and in particular when the electromagnetic radiation has an electric field component resonant with a third optical transmission of the $^{87}$Rb atoms—an absorption feature is induced within the narrow peak of probe light transmission, as shown in the lower graph. The absorption feature may split the narrow peak of probe light transmission into two transmission peaks. Measurements of the narrow peaks and the absorption feature are extremely sensitive to the electromagnetic radiation experienced by the vapor-cell sensor device 500 because the Rydberg atom transitions have large transition dipole moments and the amplitude is converted to a frequency difference. Since EIT is a coherent multi-photon process, it is sub-Doppler so it can be done in a vapor cell.

In some implementations, a vapor-cell sensor device may be formed at least in part of a dielectric material transparent to electromagnetic radiation generated by an antenna. The electromagnetic radiation may have wavelengths in the GHz-THz range, and the vapor-cell sensor device may measure characteristics of the electromagnetic radiation using atom-based electric field sensing, such as described in relation to FIGS. 1 and 5A-5B. In particular, Rydberg atom electrometry may use light fields to set up each atom in a thermal vapor as an interferometer whose optical response is perturbed in a known way by an incident microwave field (or electromagnetic radiation). The incident microwave field may resonantly interact with each atom via a Rydberg transition as shown, for example, in FIG. 5B. Measurement of the electric field component is then linked to properties of the atom and corresponding physical constants, both of which, can be established through precision measurements carried out in specialized labs. Because the example vapor-cell sensor device is formed at least in part of the dielectric material, and because the vapor-cell sensor device can also be made less than a wavelength in size, the presence of the vapor-cell sensor device within the electromagnetic radiation may minimally perturb the electromagnetic radiation. Moreover, the measurement by the atoms contained in the vapor-cell sensor device can be self-calibrated because the measurement is linked to physical constants and properties of atomic structure. The vapor-cell sensor device can be coupled remotely to a signal readout system via an optical waveguide (e.g., one or more fiber optic cables). In this way, the signal may be immune to interference and attenuation. Multiple vapor-cell sensor devices can be linked via fiber optic cables to a central servicing station. Such fiber optic links can be minimal compared to using fiber optic cables for a backhaul fiber optic connection. Furthermore, testing can occur at ground level since the vapor-cell sensor device can be mounted on the antenna.

An atom-based sensor and measurement system for radio-frequency (RF) electric fields (or electromagnetic radiation) may utilize transitions of highly excited Rydberg atoms or other atomic-scale systems. For example, $^{87}$Rb or $^{133}$Cs atoms or other types of atoms prepared (e.g., partially) in Rydberg states, color centers in dielectric matrices, or other types of atomic-scale systems may be used. The atom-based sensor may generally operate, for example, by detecting how RF electric fields affect optical transitions of the atoms. The atoms can be setup as a coherent quantum interferometer with laser fields using the principle of electromagnetically induced transparency (EIT), for example, as shown in FIG. 5B. In EIT, light from a resonant probe laser beam is transmitted through a normally absorbing material due to the presence of a strong coupling laser beam. The probe and coupling fields create quantum interference in the atom so absorption of the probe beam interferes destructively with the process of probe beam absorption and coherent excitation and de-excitation by the coupling beam. As a result, a spectrally-narrow transmission window can be created in a normally absorbing material. If an RF electric field is resonant with another transition (e.g., see FIG. 5B), the RF electric field can change the interference in the atom to induce a narrow absorption feature or split the transmission line shape that is observed as a function of the probe laser frequency.

Frequency splitting of the EIT transmission peaks, $\Delta v$, is ideally proportional to a peak amplitude, $E_0$, and depends only on the transition dipole moment, $\mu_{RF}$, of the Rydberg atom transition and Planck's constant, h, $$E_0 = \frac{h \Delta v}{\mu_{RF}}$$

an example of which, is shown in FIG. 5B. The amplitude changes of the EIT transmission peak due to the incident radiation are proportional to $E_0^2$ and can also be used to measure the incident power of the radiation field. If the response is nonlinear, under conditions where inhomogeneous broadening plays a large role, the effect of an electric field component on the probe laser transmission can be calculated to high accuracy because the Rydberg atom properties are well-known. If the probe laser is scanned in frequency in a counter-propagating coupling and probe laser geometry, the right-hand side of the expression for $E_0$ is multiplied by the ratio of probe, $\lambda_p$, to coupling laser, $\lambda_c$, wavelengths due to the residual Doppler effects caused by the wavelength mismatch. These wavelengths can be determined routinely to 1 part in $10^7$, using a Michelson interferometer, and to much higher accuracy in some cases. $\mu_{RF}$ is currently known to between 0.1-1%. Higher precision is possible, for example, if experiments are done to determine $\mu_{RF}$ using ultra-stable lasers referenced to frequency combs.

The approach is a self-calibrated way to measure electric fields in the GHz-THz regime, lower fields being in the 100 MHz regime. It is linked to precision measurements of the atom and physical constants. As an example, a minimum detectable absolute electric field amplitude of ~8 $\mu$V cm$^{-1}$ with a sensitivity of ~30 $\mu$V cm$^{-1}$ Hz$^{-1/2}$ using the absorptive signal at RF frequencies in the 5-20 GHz range, has been observed. The sensitivity may also be improved by ~10, for instance, using a homodyne detection technique. For certain contexts, the calculated shot noise limit is ~pV cm$^{-1}$, indicating that large improvements can be realized. Phase can also be measured, for instance, provided a reference wave is present—for example, using a second antenna.

In some implementations, an over-the-air (OTA) testing method can be used to measure the total radiated power (TRP) and total isotropic sensitivity (TIS) and possibly other characteristics for a base station antenna to calibrate, optimize and failure test its performance. For example, OTA testing can be performed without connectors or probe points at each antenna element, which can make OTA testing more efficient and cost-effective. Since the measurement of TRP is linked to properties of the atom through the transition dipole moments and fundamental constants that can be measured to high precision in a controlled laboratory environment, the method may provide an absolute, self-calibrated measurement of the electric field, thus the emitted power from the antenna system. The measurement can therefore act as a power standard for each antenna in some cases.

In some implementations, a method for measuring electromagnetic emissions from a cell tower includes receiving, at a vapor-cell sensor system associated with the cell tower, electromagnetic radiation from an antenna system disposed on the cell tower. The method also includes receiving, at the vapor-cell sensor system, input optical signals communicated from a laser system through respective input optical channels. The method additionally includes generating, in the vapor-cell sensor system, output optical signals based on the input optical signals and the electromagnetic radiation. The method further includes sending, from the vapor-cell sensor system, the output optical signals through one or more respective output optical channels to a detection system.

In some implementations, the electromagnetic radiation has a frequency in a range from 100 MHz to 10 THz. In some implementations, the electromagnetic radiation has a frequency in a range from 2 GHz to 75 GHz. In some implementations, the vapor-cell sensor device is formed at least in part of a dielectric material transparent to the electromagnetic radiation.

In some implementations, the laser system is coupled to the input optical channels by respective input optical ports external to the cell tower, and the detection system is coupled to the one or more output optical channels by respective output optical ports external to the cell tower. In some instances of these implementations, the laser system and the detection system are disposed on a mobile platform. In some instances of these implementations, the input optical channels and the one or more output optical channels extend from the cell tower to a remote service station. In some instances of these implementations, the input optical channels and the one or more output optical channels may extend from the cell tower to a remote service station, and the laser system and the detection system are located at the service station.

In some implementations, the antenna system is configured to produce a spatial distribution of electromagnetic radiation having at least a portion focused along a target direction. Moreover, the method includes measuring, at the detection system, a frequency-dependent transmission of light defining at least one of the output optical signals. In some instances of these implementations, receiving, at a vapor-cell sensor system, electromagnetic radiation from the antenna system includes altering the target direction while measuring the frequency-dependent transmission of light. In some instances of these implementations, measuring the frequency-dependent transmission of light includes determining a frequency separation between a pair of transmission peaks. In some instances of these implementations, measuring the frequency-dependent transmission of light includes determining an amplitude of one or both of a pair of transmission peaks. In some instances of these implementations, measuring a frequency-dependent transmission of light includes determining a total radiated power (TRP) of the antenna system. In some instances of these implementations, measuring a frequency-dependent transmission of light includes determining a total isotropic sensitivity (TIS) of the antenna system.

In some implementations, two input optical signals define the input optical signals. A single optical output single may define the one or more output optical signals. In some implementations, three input optical signals define the input optical signals. A single optical output single may define the one or more output optical signals.

In some implementations, the antenna system is configured to produce a spatial distribution of electromagnetic radiation having at least a portion focused along a target direction. In some instances, the antenna system includes a plurality of antennas, and the vapor-cell sensor system comprises a plurality of vapor-cell sensor devices, each associated with a respective one of the antennas of the antenna systems. In other instances, the antenna system includes a plurality of antennas and the vapor-cell sensor system includes subgroups of vapor-cell sensor devices, and each subgroup is associated with a single respective antenna of the plurality of antennas.

A system for measuring electromagnetic emissions from a cell tower may be also be described by the following examples:

Example 1

A system for measuring electromagnetic emissions from a cell tower, the system comprising:
  a vapor-cell sensor system positioned to receive electromagnetic radiation from an antenna system disposed on the cell tower, the vapor-cell sensor system configured to generate one or more output optical signals based on the electromagnetic radiation and input optical signals;
  input optical channels configured to communicate the input optical signals from a laser system to the vapor-cell sensor system; and
  one or more output optical channels configured to communicate the one or more output optical signals from the vapor-cell sensor system to a detection system.

Example 2

The system of example 1, wherein the antenna system is configured to produce a spatial distribution of electromagnetic radiation having at least a portion focused along a target direction.

Example 3

The system of example 1 or 2, wherein the vapor-cell sensor system includes a vapor-cell sensor device formed at least in part of a dielectric material that is transparent to the electromagnetic radiation.

Example 4

The system of example 1 or any of examples 2-3, wherein at least a portion of the input optical channels and at least a portion of the one or more output optical channels are defined by fiber optic cables.

Example 5

The system of example 1 or any of examples 2-4, comprising:
the laser system, configured to generate the input optical signals and couple to input optical ports associated with the input optical channels; and
the detection system, configured to receive the one or more output optical signals and couple to output optical ports associated with the one or more output optical channels.

Example 6

The system of example 5, wherein the input optical ports and the output optical ports are external to the cell tower.

Example 7

The system of example 5 or 6, wherein the laser system and the detection system are disposed on a mobile platform.

Example 8

The system of example 5,
wherein the input optical ports and the output optical ports are located at a remote service station; and
wherein the input optical channels extend from the vapor-cell sensor system to the input optical ports and the one or more output optical channels extend from the vapor-cell sensor system to the output optical ports.

Example 9

The system of example 8, wherein the laser system and the detection system are disposed on a mobile platform.

Example 10

The system of example 8, wherein the laser system and the detection system are located at the remote service station.

Example 11

The method of example 1 or any of examples 2-10, wherein two input optical signals define the input optical signals.

Example 12

The method of example 11, wherein a single output optical signal defines the one or more output optical signals.

Example 13

The method of example 1 or any of examples 2-10, wherein three input optical signals define the input optical signals.

Example 14

The system of example 1 or any of examples 2-13, wherein the electromagnetic radiation has a frequency in a range from 100 MHz to 10 THz.

Example 15

The system of example 1 or any of examples 2-33, wherein the electromagnetic radiation has a frequency in a range from 2 GHz to 75 GHz.

A method for measuring electromagnetic emissions from a cell tower may be also be described by the following examples:

Example 16

A method for measuring electromagnetic emissions from a cell tower, the method comprising:
receiving, at a vapor-cell sensor system associated with the cell tower, electromagnetic radiation from an antenna system disposed on the cell tower;
receiving, at the vapor-cell sensor system, input optical signals communicated from a laser system through respective input optical channels;
generating, in the vapor-cell sensor system, output optical signals based on the input optical signals and the electromagnetic radiation; and
sending, from the vapor-cell sensor system, the output optical signals through one or more respective output optical channels to a detection system.

Example 17

The method of example 16, wherein the antenna system is configured to produce a spatial distribution of electromagnetic radiation having at least a portion focused along a target direction.

Example 18

The method of example 17, wherein the antenna system comprises a plurality of antennas, and the vapor-cell sensor system comprises a plurality of vapor-cell sensor devices, each associated with a respective one of the antennas of the antenna systems.

Example 19

The method of example 17, wherein the antenna system comprises a plurality of antennas, the vapor-cell sensor system comprises subgroups of vapor-cell sensor devices, and each subgroup is associated with a single respective antenna of the plurality of antennas.

Example 20

The method of example 16 or any one of examples 17-19,
wherein the laser system is coupled to the input optical channels by respective input optical ports external to the cell tower;

wherein the detection system is coupled to the one or more output optical channels by respective output optical ports external to the cell tower.

Example 21

The method of example 20, wherein the laser system and the detection system are disposed on a mobile platform.

Example 22

The method of example 20 or 21, wherein the input optical channels and the one or more output optical channels extend from the cell tower to a remote service station.

Example 23

The method of example 20,
wherein the input optical channels and the one or more output optical channels extend from the cell tower to a remote service station; and
wherein the laser system and the detection system are located at the service station.

Example 24

The method of example 16 or any one of examples 17-23, wherein the vapor-cell sensor device is formed at least in part of a dielectric material transparent to the electromagnetic radiation.

Example 25

The method of example 16 or any one of examples 17-24,
wherein the antenna system is configured to produce a spatial distribution of electromagnetic radiation having at least a portion focused along a target direction; and
wherein the method comprises measuring, at the detection system, a frequency-dependent transmission of light defining at least one of the output optical signals.

Example 26

The method of example 25, wherein receiving, at a vapor-cell sensor system, electromagnetic radiation from the antenna system comprises altering the target direction while measuring the frequency-dependent transmission of light.

Example 27

The method of example 25 or 26, wherein measuring the frequency-dependent transmission of light comprises determining a frequency separation between a pair of transmission peaks.

Example 28

The method of example 25 or any of examples 26-27, wherein measuring the frequency-dependent transmission of light comprises determining an amplitude of one or both of a pair of transmission peaks.

Example 29

The method of example 25 or any of examples 26-28, wherein measuring a frequency-dependent transmission of light comprises determining a total radiated power of the antenna system.

Example 30

The method of example 25 or any of examples 26-29, wherein measuring a frequency-dependent transmission of light comprises determining a total isotropic sensitivity of the antenna system.

Example 31

The method of example 16 or any of examples 26-30, wherein two input optical signals define the input optical signals.

Example 32

The method of example 31, wherein a single output optical signal defines the one or more output optical signals.

Example 33

The method of example 16 or any of examples 26-30, wherein three input optical signals define the input optical signals.

Example 34

The method of example 16 or any of examples 26-33, wherein the electromagnetic radiation has a frequency in a range from 100 MHz to 10 THz.

Example 35

The method of example 16 or any of examples 26-34, wherein the electromagnetic radiation has a frequency in a range from 2 GHz to 75 GHz.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A method for measuring electromagnetic emissions from a cell tower, the method comprising:
   receiving, at a vapor-cell sensor system associated with the cell tower, electromagnetic radiation from an antenna system disposed on the cell tower;
   receiving, at the vapor-cell sensor system, input optical signals communicated from a laser system through respective input optical channels;
   generating, in the vapor-cell sensor system, output optical signals based on the input optical signals and the electromagnetic radiation; and
   sending, from the vapor-cell sensor system, the output optical signals through one or more respective output optical channels to a detection system.

2. The method of claim 1, wherein the antenna system is configured to produce a spatial distribution of electromagnetic radiation having at least a portion focused along a target direction.

3. The method of claim 2, wherein the antenna system comprises a plurality of antennas, and the vapor-cell sensor system comprises a plurality of vapor-cell sensor devices, each associated with a respective one of the antennas of the antenna systems.

4. The method of claim 2, wherein the antenna system comprises a plurality of antennas, the vapor-cell sensor system comprises subgroups of vapor-cell sensor devices, and each subgroup is associated with a single respective antenna of the plurality of antennas.

5. The method of claim 1,
   wherein the laser system is coupled to the input optical channels by respective input optical ports external to the cell tower;
   wherein the detection system is coupled to the one or more output optical channels by respective output optical ports external to the cell tower.

6. The method of claim 5, wherein the laser system and the detection system are disposed on a mobile platform.

7. The method of claim 5, wherein the input optical channels and the one or more output optical channels extend from the cell tower to a remote service station.

8. The method of claim 5,
   wherein the input optical channels and the one or more output optical channels extend from the cell tower to a remote service station; and
   wherein the laser system and the detection system are located at the service station.

9. The method of claim 1, wherein the vapor-cell sensor device is formed at least in part of a dielectric material transparent to the electromagnetic radiation.

10. The method of claim 1,
    wherein the antenna system is configured to produce a spatial distribution of electromagnetic radiation having at least a portion focused along a target direction; and
    wherein the method comprises measuring, at the detection system, a frequency-dependent transmission of light defining at least one of the output optical signals.

11. The method of claim 10, wherein receiving, at a vapor-cell sensor system, electromagnetic radiation from the antenna system comprises altering the target direction while measuring the frequency-dependent transmission of light.

12. The method of claim 10, wherein measuring the frequency-dependent transmission of light comprises determining a frequency separation between a pair of transmission peaks.

13. The method of claim 10, wherein measuring the frequency-dependent transmission of light comprises determining an amplitude of one or both of a pair of transmission peaks.

14. The method of claim 10, wherein measuring a frequency-dependent transmission of light comprises determining a total radiated power of the antenna system.

15. The method of claim 10, wherein measuring a frequency-dependent transmission of light comprises determining a total isotropic sensitivity of the antenna system.

16. The method of claim 1, wherein two input optical signals define the input optical signals.

17. The method of claim 1, wherein three input optical signals define the input optical signals.

18. A system for measuring electromagnetic emissions from a cell tower, the system comprising:
    a vapor-cell sensor system positioned to receive electromagnetic radiation from an antenna system disposed on the cell tower, the vapor-cell sensor system configured to generate one or more output optical signals based on the electromagnetic radiation and input optical signals;
    input optical channels configured to communicate the input optical signals from a laser system to the vapor-cell sensor system; and
    one or more output optical channels configured to communicate the one or more output optical signals from the vapor-cell sensor system to a detection system.

19. The system of claim 18, wherein the antenna system is configured to produce a spatial distribution of electromagnetic radiation having at least a portion focused along a target direction.

20. The system of claim 18, wherein the vapor-cell sensor system includes a vapor-cell sensor device formed at least in part of a dielectric material that is transparent to the electromagnetic radiation.

21. The system of claim 18, wherein at least a portion of the input optical channels and at least a portion of the one or more output optical channels are defined by fiber optic cables.

22. The system of claim 18, comprising:
    the laser system, configured to generate the input optical signals and couple to input optical ports associated with the input optical channels; and
    the detection system, configured to receive the one or more output optical signals and couple to output optical ports associated with the one or more output optical channels.

23. The system of claim 22, wherein the input optical ports and the output optical ports are external to the cell tower.

24. The system of claim 22, wherein the laser system and the detection system are disposed on a mobile platform.

25. The system of claim 22,
    wherein the input optical ports and the output optical ports are located at a remote service station; and
    wherein the input optical channels extend from the vapor-cell sensor system to the input optical ports and the one or more output optical channels extend from the vapor-cell sensor system to the output optical ports.

26. The system of claim 25, wherein the laser system and the detection system are disposed on a mobile platform.

27. The system of claim 25, wherein the laser system and the detection system are located at the remote service station.

28. The method of claim 18, wherein two input optical signals define the input optical signals.

29. The method of claim 28, wherein a single output optical signal defines the one or more output optical signals.

30. The method of claim 18, wherein three input optical signals define the input optical signals.

31. The method of claim 16, wherein a single output optical signal defines the one or more output optical signals.

32. The method of claim 1, wherein the electromagnetic radiation has a frequency in a range from 100 MHz to 10 THz.

33. The method of claim 1, wherein the electromagnetic radiation has a frequency in a range from 2 GHz to 75 GHz.

34. The system of claim 18, wherein the electromagnetic radiation has a frequency in a range from 100 MHz to 10 THz.

35. The system of claim 18, wherein the electromagnetic radiation has a frequency in a range from 2 GHz to 75 GHz.

* * * * *

UNITED STATES PATENT AND TRADEMARK OFFICE
CERTIFICATE OF CORRECTION

PATENT NO. : 10,564,201 B1  
APPLICATION NO. : 16/410428  
DATED : February 18, 2020  
INVENTOR(S) : Shaffer Page 1 of 1

It is certified that error appears in the above-identified patent and that said Letters Patent is hereby corrected as shown below:

On the Title Page

Item (56), Column 2, Line 1, delete "CIPO,International" and insert -- CIPO, International -- therefor.

Page 2, Column 2, Line 24, delete "Ribidium" and insert -- Rubidium -- therefor.

In the Specification

Column 4, Line 63, delete "160." and insert -- 106. -- therefor.

Column 5, Line 38, delete "204" and insert -- 240 -- therefor.

In the Claims

Column 20, Line 66, Claim 28, delete "method" and insert -- system -- therefor.

Column 21, Line 1, Claim 29, delete "method" and insert -- system -- therefor.

Column 21, Line 3, Claim 30, delete "method" and insert -- system -- therefor.

Signed and Sealed this  
Sixteenth Day of June, 2020

Andrei Iancu  
*Director of the United States Patent and Trademark Office*